(12) United States Patent
Tsai et al.

(10) Patent No.: US 12,740,495 B2
(45) Date of Patent: Sep. 15, 2026

(54) SEMICONDUCTOR MODULE HAVING SIGNAL ASSEMBLY IN FIRST AND SECOND MOLDING COMPOUND

(71) Applicant: ACTRON TECHNOLOGY CORPORATION, Taoyuan City (TW)

(72) Inventors: Hsin-Chang Tsai, Taoyuan City (TW); Ching-Wen Liu, Taoyuan City (TW)

(73) Assignee: ACTRON TECHNOLOGY CORPORATION, Taoyuan City (TW)

( * ) Notice: Subject to any disclaimer, the term of this patent is extended or adjusted under 35 U.S.C. 154(b) by 357 days.

(21) Appl. No.: 18/495,688

(22) Filed: Oct. 26, 2023

(65) Prior Publication Data

US 2025/0096086 A1 Mar. 20, 2025

(30) Foreign Application Priority Data

Sep. 20, 2023 (TW) ................................ 112135785

(51) Int. Cl.

*H10W 90/00* (2026.01)
*H10W 74/01* (2026.01)
*H10W 74/10* (2026.01)

(52) U.S. Cl.

CPC ......... *H10W 90/701* (2026.01); *H10W 74/01* (2026.01); *H10W 74/114* (2026.01); (Continued)

(58) Field of Classification Search

CPC . H10W 90/701; H10W 74/114; H10W 90/00; H10W 74/01

See application file for complete search history.

(56) References Cited

U.S. PATENT DOCUMENTS 11,004,698 B2 5/2021 Lee et al.
2010/0013086 A1* 1/2010 Obiraki .............. H10W 40/255 257/E23.116

(Continued)

FOREIGN PATENT DOCUMENTS

CN 112271165 1/2021
EP 4207269 7/2023

(Continued)

OTHER PUBLICATIONS

"Office Action of Japan Counterpart Application", issued on Mar. 3, 2025, p. 1-p. 7.

(Continued)

*Primary Examiner* — Michael Jung
(74) *Attorney, Agent, or Firm* — JCIPRNET

(57) ABSTRACT

A semiconductor module includes a substrate, at least one chip, at least one signal assembly, a first molding compound, and a second molding compound. The chip is disposed on the substrate and electrically connected to the substrate. The signal assembly is disposed on the substrate in a normal direction of the substrate and electrically connected to the substrate. The first molding compound is disposed on the substrate. The first molding compound at least covers the chip and has at least one opening, and the opening exposes the signal assembly. The second molding compound is disposed on the substrate and fills the opening. The second molding compound is located between the signal assembly and the first molding compound, and covers the signal assembly. At least one contact interface is formed between the second molding compound and the first molding compound.

3 Claims, 3 Drawing Sheets

(52) U.S. Cl.
CPC .......... *H10W 90/00* (2026.01); *H10W 90/754* (2026.01); *H10W 90/764* (2026.01)

(56) References Cited

U.S. PATENT DOCUMENTS

| | | | | |
|---|---|---|---|---|
| 2015/0103498 | A1* | 4/2015 | Lee | H10W 74/016<br>361/728 |
| 2015/0145123 | A1 | 5/2015 | Ha | |
| 2022/0108939 | A1* | 4/2022 | Minotti | H10W 72/50 |
| 2023/0178506 | A1* | 6/2023 | Morisada | H10W 90/701<br>257/737 |
| 2023/0215788 | A1 | 7/2023 | Luo et al. | |
| 2024/0071892 | A1* | 2/2024 | Kim | H10W 70/65 |
| 2024/0404926 | A1* | 12/2024 | Chi | H10W 70/424 |

FOREIGN PATENT DOCUMENTS

| | | |
|---|---|---|
| JP | 2011124366 | 6/2011 |
| TW | 202141718 | 11/2021 |

OTHER PUBLICATIONS

"Search Report of Europe Counterpart Application", issued on Jul. 10, 2024, p. 1-p. 7.

* cited by examiner 115
110
132(130)
125
120
125
125
120
125
132(130)
S1
S2
115
N 140
115b
110
115
115a
142
132(130)
125
120
125
125
120
125
142
132(130)
S1
S2
115a
115
115b
N

SEMICONDUCTOR MODULE HAVING SIGNAL ASSEMBLY IN FIRST AND SECOND MOLDING COMPOUND

CROSS-REFERENCE TO RELATED APPLICATION

This application claims the priority benefit of Taiwan application serial no. 112135785, filed on Sep. 20, 2023. The entirety of the above-mentioned patent application is hereby incorporated by reference herein and made a part of this specification.

BACKGROUND

Technical Field

This disclosure relates to a module and a manufacturing method thereof, and in particular to a semiconductor module and a manufacturing method thereof.

Description of Related Art

In order to increase the power density of power elements and achieve low cost requirements, multiple semiconductor elements are often combined in a package structure to form a power module, which provides high output power in a small package structure. Generally, the signal source of a power module protrudes from the side of the package. However, this design results in higher parasitic inductance due to longer current paths, which in turn affects element performance.

SUMMARY

The disclosure provides a semiconductor module, capable of effectively shortening a current path to reduce parasitic inductance, and having a better structural reliability.

The disclosure further provides a manufacturing method of a semiconductor module to manufacture the semiconductor module.

The semiconductor module of the disclosure includes a substrate, at least one chip, at least one signal assembly, a first molding compound, and a second molding compound. The at least one chip is disposed on the substrate and is electrically connected to the substrate. The at least one signal assembly is disposed on the substrate in a normal direction of the substrate and is electrically connected to the substrate. The first molding compound is disposed on the substrate. The first molding compound at least covers the at least one chip and has at least one opening, and the at least one opening exposes the at least one signal assembly. The second molding compound is disposed on the substrate and fills the at least one opening. The second molding compound is located between the at least one signal assembly and the first molding compound, and covers the at least one signal assembly. At least one contact interface is formed between the second molding compound and the first molding compound.

In an embodiment of the disclosure, the at least one signal assembly includes at least one power semiconductor package signal connection element and at least one implanted signal pin. The at least one power semiconductor package signal connection element is disposed on the substrate. The first molding compound exposes the at least one power semiconductor package signal connection element. The at least one implanted signal pin is inserted into the at least one power semiconductor package signal connection element. The second molding compound covers the at least one power semiconductor package signal connection element and a portion of the at least one implanted signal pin.

In an embodiment of the disclosure, the semiconductor module further includes at least one connector that electrically connecting at least one chip and the substrate.

In an embodiment of the disclosure, the substrate has an upper surface and a lower surface opposite to each other and includes multiple pins. Each of the pins includes an inner pin part and an outer pin part. The first molding compound covers the upper surface of the substrate and the inner pin part of the each of the pins, and the outer pin part of the each of the pins protrudes out of the first molding compound.

A manufacturing method of a semiconductor module of the disclosure includes the following. A substrate is provided. At least one chip is disposed on the substrate. The at least one chip is electrically connected to the substrate. At least one signal assembly is disposed on the substrate in a normal direction of the substrate, and the at least one signal assembly is electrically connected to the substrate. A first molding compound is formed on the substrate. The first molding compound at least covers the at least one chip and has at least one opening. The at least one opening exposes the at least one signal assembly. A second molding compound is formed on the substrate and fills the at least one opening. The second molding compound is located between the at least one signal assembly and the first molding compound, and covers the at least one signal assembly. At least one contact interface is formed between the second molding compound and the first molding compound.

In an embodiment of the disclosure, the at least one signal assembly includes at least one power semiconductor package signal connection element and at least one implanted signal pin. Before the first molding compound is formed on the substrate, the at least one power semiconductor package signal connection element is disposed on the substrate. When the first molding compound is formed on the substrate, the first molding compound exposes at least one power semiconductor package signal connection element. Before the second molding compound is formed on the substrate, the at least one implanted signal pin is inserted into the at least one power semiconductor package signal connection element. When the second molding compound is formed on the substrate, the second molding compound covers the at least one power semiconductor package signal connection element and a portion of the at least one implanted signal pin.

In an embodiment of the disclosure, the manufacturing method of a semiconductor module further includes that at least one connector is formed before the first molding compound is formed on the substrate. The at least one connector electrically connects the at least one chip and the substrate.

In an embodiment of the disclosure, the substrate has an upper surface and a lower surface opposite to each other and includes multiple pins. When the first molding compound is formed on the substrate, the first molding compound covers the upper surface of the substrate and a portion of each of the pins, where the portion of the each of the pins is defined as an inner pin part of the each of the pins, and an other portion of the each of the pins protrudes out of the first molding compound, where the other portion of the each of the pins is defined as an outer pin part of the each of the pins.

In an embodiment of the disclosure, the manufacturing method of the second molding compound on the substrate includes that a liquid epoxy resin is filled into the at least one opening.

In an embodiment of the disclosure, the substrate includes a direct bonded copper substrate (DBC) substrate, an insulated metal substrate (IMS), or an active metal bonding (AMB) substrate.

Based on the above, in the design of the semiconductor module of the disclosure, the signal assembly is disposed on the substrate in the normal direction of the substrate and is electrically connected to the substrate, the first molding compound covers the chip and exposes the signal assembly, the second molding compound covers the signal assembly, and the contact interface is formed between the second molding compound and the first molding compound. This design may effectively shorten the current path between the substrate and the signal assembly to reduce parasitic inductance, and because the first molding compound and the second molding compound are each formed as an independent component, packaging stress may be effectively balanced and pull-out force of the signal assembly may be increased, which may make the semiconductor module of the disclosure have a better structural reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

FIG. 1A to FIG. 1D are schematic cross-sectional views of a manufacturing method of a semiconductor module according to an embodiment of the disclosure. Regarding the manufacturing method of the semiconductor module in this embodiment, first, referring to FIG. 1A, a substrate 110 is provided. The substrate 110 is, for example, a direct bonded copper (DBC) substrate, an insulated metal substrate (IMS), or an active metal bonding (AMB) substrate, but is not limited thereto. In this embodiment, the substrate 110 has an upper surface S1 and a lower surface S2 opposite to each other, and the substrate 110 includes multiple pins 115 (two pins 115 are shown schematically). The pins 115 are respectively disposed on the upper surface S1 of the substrate 110.

Figures 1A, 1B:
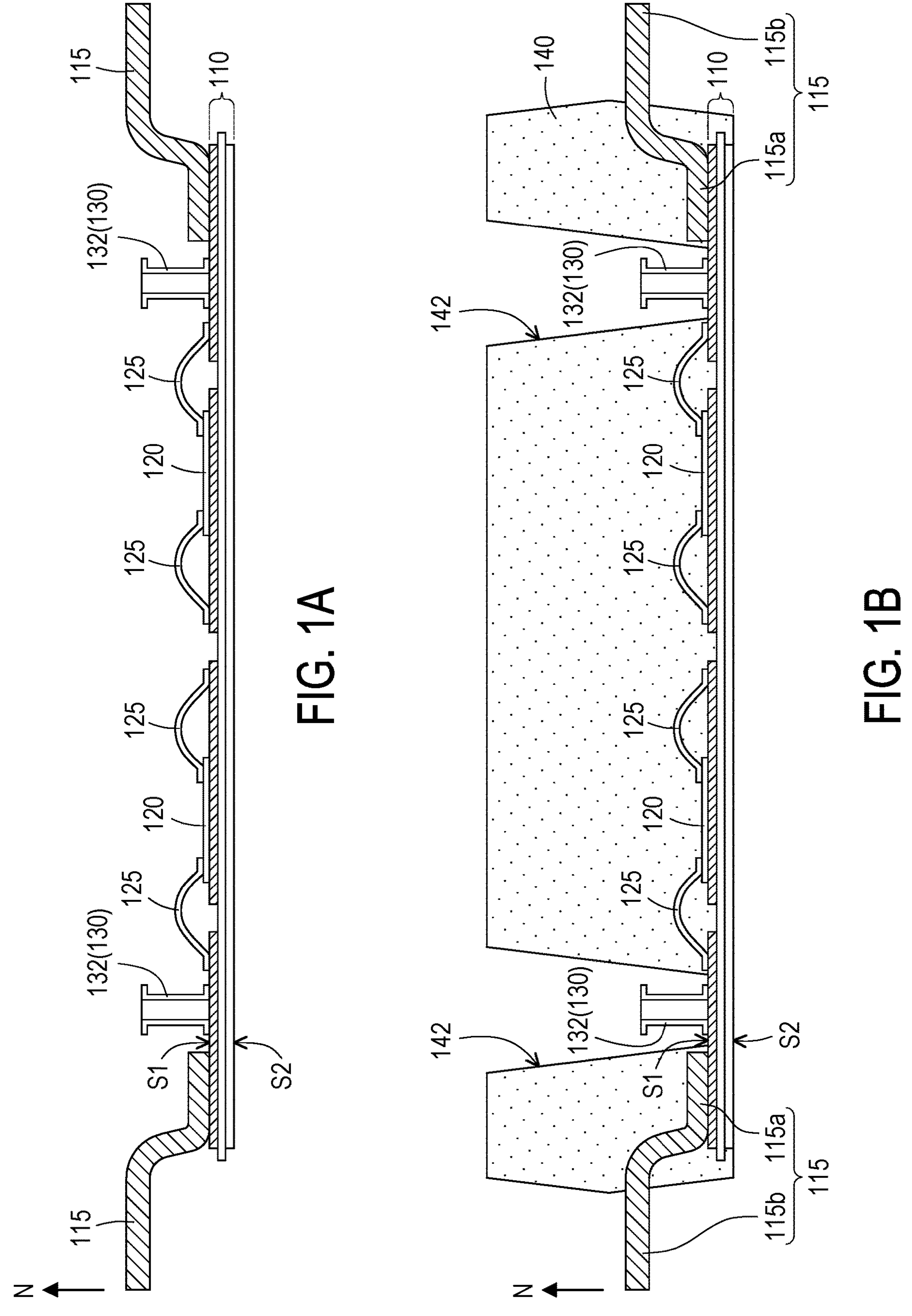
FIG. 1A to FIG. 1D are schematic cross-sectional views of a manufacturing method of a semiconductor module according to an embodiment of the disclosure.

Next, referring to FIG. 1A, at least one chip 120 (two chips 120 are shown schematically) is disposed on the substrate 110. The chips 120 are disposed apart from each other on the upper surface S1 of the substrate 110 and are located between the pins 115. The chip 120 may be, for example, an insulated gate bipolar transistor (IGBT) or a SiC metal-oxide-semiconductor field-effect transistor diode (SiC MOSFET Diode).

Next, referring to FIG. 1A again, at least one connector 125 (four connectors 125 are shown schematically) are formed. The connector 125 electrically connects the chip 120 and the substrate 110. That is, the chip 120 is electrically connected to the substrate 110 through the connector 125. Here, the connector 125 may be, for example, a welding wire or a metal clip, but is not limited thereto.

Next, referring to FIG. 1A again, at least one signal assembly 130 (two signal assemblies 130 are shown schematically) is disposed on the substrate 110 in a normal direction N of the substrate 110. Further, each of the signal assemblies 130 includes a power semiconductor package signal connection element 132 and an implanted signal pin 134 (please refer to FIG. 1C). Here, the power semiconductor package signal connection element 132 of the each of the signal assemblies 130 is first disposed on the first surface S1 of the substrate 110 in a direction perpendicular to a direction of extension (i.e., the normal direction N) of the substrate 110. That is, the power semiconductor package signal connection element 132 and the chip 120 are located on the same surface of the substrate 110. The power semiconductor package signal connection element 132 is located between the chip 120 and the pin 115, and the power semiconductor package signal connection element 132 may be fixed on the substrate 110 by welding, for example.

Next, referring to FIG. 1B, a first molding compound 140 is formed on the substrate 110 by molding. The first molding compound 140 at least covers the chip 120 and has at least one opening 142 (two openings 142 are shown schematically), and each of the openings 142 exposes a corresponding power semiconductor package signal connection element 132 of the signal assembly 130. That is, in this embodiment, the opening 142 is not formed through mechanical or laser drilling methods. Here, for example, a diameter of the opening 142 decreases gradually from a direction away from the substrate 110 to a direction close to the substrate 110, but is not limited thereto. As shown in FIG. 1B, the first molding compound 140 covers a portion of the upper surface S1 of the substrate 110, the chip 120, the connector 125, and a portion of each of the pins 115, where the portion of the each of the pins 115 may be defined as an inner pin part 115*a* of the each of the pins. An other portion of the each of the pins 115 protrudes out of the first molding compound 140, where the other portion of the each of the pins 115 may be defined as an outer pin part 115*b* of the each of the pins 115. Here, a material of the first molding compound 140 is, for example, solid epoxy molding compound (EMC).

Figure 1C:
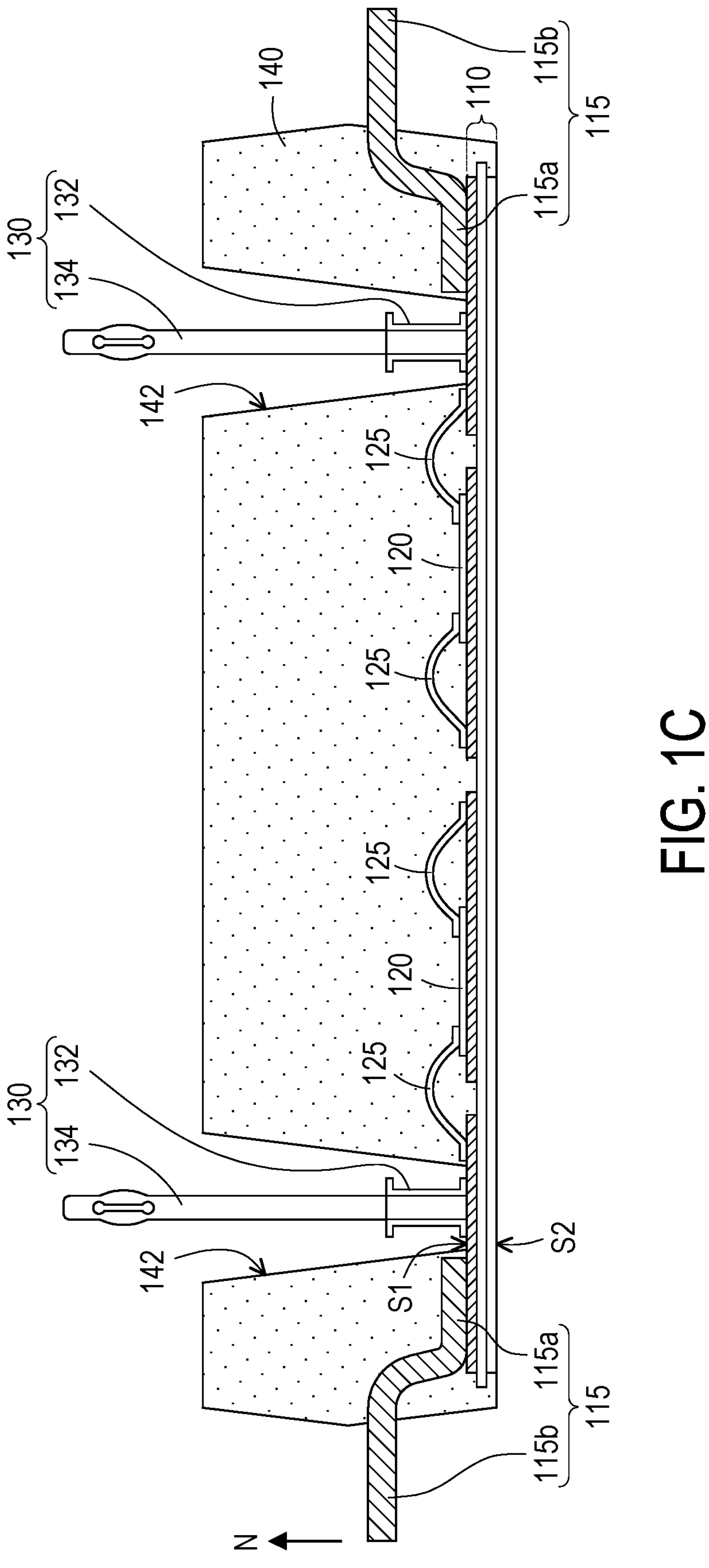

Then, referring to FIG. 1C, the implanted signal pin 134 is inserted into the power semiconductor package signal connection element 132 correspondingly, so that the signal assembly 130 and the substrate 110 are electrically connected. Here, the implanted signal pin 134 is specified as a vertical signal terminal and is directly inserted (contacted) on the first surface S1 of the substrate 110, which may effectively shorten a current path between the substrate 110 and the signal assembly 130, and may reduce parasitic inductance.

Figure 1D:
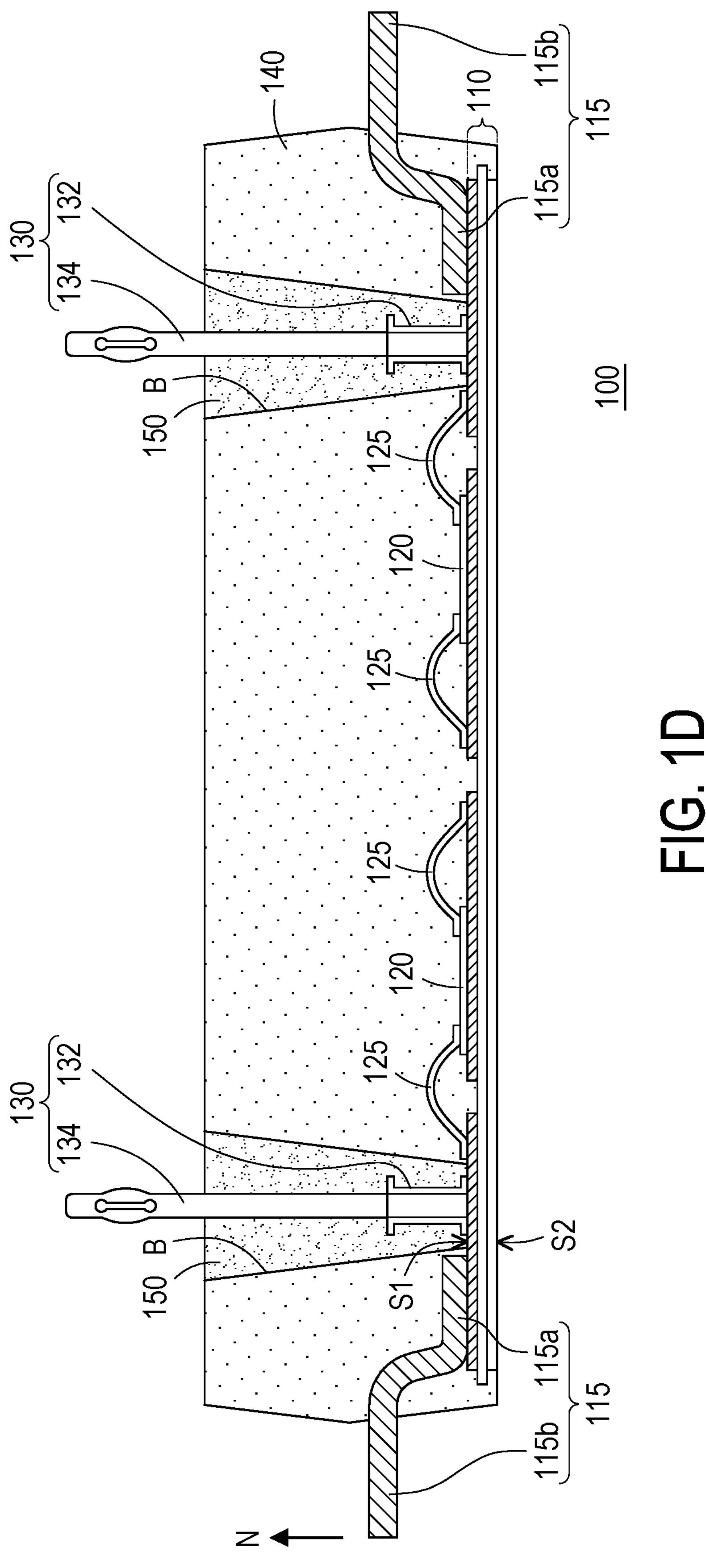

Finally, referring to FIG. 1C and FIG. 1D at the same time, a second molding compound 150 is formed on the substrate 110 and fills the opening 142. A method of forming the second molding compound 150 on the substrate 110 is, for example, filling the opening 142 with a liquid epoxy resin. That is, a material of the second molding compound 150 is liquid epoxy resin. Since the second molding compound 150 and the first molding compound 140 are independent components, formed separately and not integrally formed, a contact interface B is formed between the second molding compound 150 and the first molding compound 140. Here, the second molding compound 150 is located between the signal assembly 130 and the first molding compound 140, and the second molding compound 150 covers the power semiconductor package signal connection element 132 and a portion of the implanted signal pin 134 of the signal assembly 130. That is, a portion of the implanted signal pin 134 protrudes out of the second molding compound 150, and the portion of the implanted signal pin 134 protruding out of the second molding compound 150 are parallel to the normal direction N of the substrate 110.

Since the first molding compound 140 and the second molding compound 150 are formed at different times, the contact interface B is formed between them, and colors and light refractive indexes of the first molding compound 140 and the second molding compound 150 are different. During packaging, due to a mismatch in thermal expansion coefficients between materials of elements, the substrate is prone to warpage due to stress residue caused by temperature change. Since the first molding compound 140 is first formed by molding in this embodiment, and then the opening 142 of the first molding compound 140 is poured/filled into the second molding compound 150, in addition to effectively balancing packaging stress, pull-out force of the implanted signal pin 134 of the signal assembly 130 may also be increased, so that a semiconductor module 100 of the embodiment may have a better structural reliability.

In addition, since the first molding compound 140 having the opening 142 is formed by molding, where the opening 142 may expose correspondingly the power semiconductor package signal connection element 132 of the signal assembly 130, there is no need to remove a portion of the molding compound, and the implanted signal pin 134 is inserted into the power semiconductor package signal connection element 132 in a direct contact with the substrate 110, thus also eliminating the need for solder connections and effectively reducing costs.

Structurally, referring to FIG. 1D again, the semiconductor module 100 includes a substrate 110, a chip 120, a signal assembly 130, a first molding compound 140, and a second molding compound 150. The chip 120 is disposed on the substrate 110 and is electrically connected to the substrate 110. The signal assembly 130 is disposed on the substrate 110 in a normal direction N of the substrate 110 and is electrically connected to the substrate 110. The first molding compound 140 is disposed on the substrate 110. The first molding compound 140 at least covers the chip 120 and has an opening 142, and the opening 142 exposes the signal assembly 130. The second molding compound 150 is disposed on the substrate 110 and fills the opening 142. The second molding compound 150 is located between the signal assembly 130 and the first molding compound 140, and covers the signal assembly 130, where a contact interface B is formed between the second molding compound 150 and the first molding compound 140.

Further, in this embodiment, the substrate 110 has an upper surface S1 and a lower surface S2 opposite to each other and includes multiple pins 115. Each of the pins 115 includes an inner pin part 115*a* and an outer pin part 115*b*. The first molding compound 140 covers the upper surface S1 of the substrate 110 and the inner pin part 115*a* of the each of the pins 115, and the outer pin part 115*b* of the each of the pins 115 protrudes out of the first molding compound 140. Furthermore, the semiconductor module 100 also includes a connector 125 electrically connects the chip 120 and the substrate 110. In addition, the signal assembly 130 of this embodiment includes a power semiconductor package signal connection element 132 and an implanted signal pin 134. The power semiconductor package signal connection element 132 is disposed on the substrate 110, where the first molding compound 140 exposes the power semiconductor package signal connection element 132. The implanted signal pin 134 is inserted into the power semiconductor package signal connection element 132, and is in direct contact with the substrate 110, where the second molding compound 150 covers the power semiconductor package signal connection element 132 and a portion of the implanted signal pin 134.

To sum up, in the design of the semiconductor module of the disclosure, the signal assembly is disposed on the substrate in the normal direction of the substrate and is physically and electrically connected to the substrate, the first molding compound covers the chip and exposes the signal assembly, the second molding compound covers the signal assembly, and the contact interface is formed between the second molding compound and the first molding compound. This design may effectively shorten the current path between the substrate and the signal assembly to reduce parasitic inductance, and because the first molding compound and the second molding compound are each formed as an independent component, packaging stress may be effectively balanced and pull-out force of the signal assembly may be increased, which may make the semiconductor module of the disclosure have a better structural reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor module comprising:

a substrate;

at least one chip disposed on the substrate and electrically connected to the substrate;

at least one signal assembly disposed on the substrate in a normal direction of the substrate and electrically connected to the substrate;

a first molding compound disposed on the substrate, the first molding compound at least covering the at least one chip and having at least one opening, and the at least one opening exposing the at least one signal assembly; and a second molding compound disposed on the substrate and filling the at least one opening, the second molding compound located between the at least one signal assembly and the first molding compound and covering the at least one signal assembly, wherein at least one contact interface is formed between the second molding compound and the first molding compound, wherein the at least one signal assembly comprises:

at least one power semiconductor package signal connection element disposed on the substrate, wherein the first molding compound exposes the at least one power semiconductor package signal connection element; and at least one implanted signal pin inserted into the at least one power semiconductor package signal connection element in a direct contact with the substrate, wherein the second molding compound covers the at least one power semiconductor package signal connection element and a portion of the at least one implanted signal pin.

2. The semiconductor module according to claim 1 further comprising:

at least one connector electrically connects the at least one chip and the substrate.

3. The semiconductor module according to claim 1, wherein the substrate has an upper surface and a lower surface opposite to each other and comprises a plurality of pins, each of the pins comprises an inner pin part and an outer pin part, the first molding compound covers the upper surface of the substrate and the inner pin part of the each of the pins, and the outer pin part of the each of the pins protrudes out of the first molding compound.

* * * * *